United States Patent [19]

Paul

[11] Patent Number: 4,491,977

[45] Date of Patent: Jan. 1, 1985

[54] MILLIMETER-WAVE QUASI-OPTICAL PLANAR BALANCED MIXER

[75] Inventor: Jeffrey A. Paul, Torrance, Calif.

[73] Assignee: Hughes Aircraft Company, El Segundo, Calif.

[21] Appl. No.: 387,059

[22] Filed: Jun. 10, 1982

[51] Int. Cl.³ .............................................. H04B 1/26
[52] U.S. Cl. ............................ 455/327; 343/700 MS; 455/330
[58] Field of Search .................. 455/327, 330, 619; 333/247; 307/425, 426, 427, 428, 430; 343/700 MS, 753, 754; 330/4.6, 4.9

[56] References Cited

U.S. PATENT DOCUMENTS 2,822,541  2/1958  Sichak et al. .............. 343/700 MS
4,215,313  7/1980  Chang et al. ............... 455/326
4,276,655  6/1981  Kraemer et al. ............. 455/327

OTHER PUBLICATIONS

Kerr et al.–"A Simple Quasi-Optical Mixer"–IEEE Microwave Theory and Tech. Intern. Microwave Symposium Dig.–Jun. 1977.
Swanberg et al.–"Quasi-Optical Mixer"–Microwave System News–vol. 9, No. 5, May 1979, pp. 58–60.
Wrixon–A 350–400 GHz Superheterodyne Receiver–GSA Jour. 1979, vol. 3, No. 3, pp. 201–206.
Hackmeister–"Radio Receiver"–Electronic Design 23, Nov. 8, 1977, pp. 26, 27.

Primary Examiner—Joseph A. Orsino, Jr.
Attorney, Agent, or Firm—Charles D. Brown; A. W. Karambeles

[57] ABSTRACT

A millimeter-wave, planar, balanced mixer having optical means for coupling radio frequency waves to the mixer circuit. The optical coupling means may comprise a dielectric lens and particularly a spherical dielectric lens. The spherical lens not only provides a gain for the radio frequency energy but overcomes the severe tolerance requirements and size restrictions encountered in fabrication of conventional waveguides for millimeter waves in the range of 100 to 300 GHz.

9 Claims, 3 Drawing Figures

MILLIMETER-WAVE QUASI-OPTICAL PLANAR BALANCED MIXER

BACKGROUND OF THE INVENTION

1. Field of the Invention

The invention relates to a millimeter-wave balanced mixer, and in particular to a quasi-optical mixer fabricated in planar form, i.e. fabricated as a microwave integrated circuit.

2. Description of the Prior Art

The technology related to microwave integrated circuit planar balanced mixers has progressed significantly in recent years. Mixers have been fabricated which are capable of operating at ever increasing RF frequency. One such mixer circuit is shown in U.S. Pat. No. 4,215,313, issued July 29, 1980 to Chang et al. and assigned to the assignee of the present invention. That patent, entitled "Dielectric Image Guide Integrated Harmonic Pumped Mixer" shows a mixer circuit employing a reverse poled diode pair (16, 18) mounted within a mixer cavity. LO (local oscillator) power is provided to the mixer cavity through a first dielectric image guide strip and RF (radio frequency) energy is provided to the mixer cavity through a second dielectric image guide strip. The cross-sectional dimensions of each guide strip are determined by the frequency of the signal to be propagated through the strip. For a given frequency, the waveguide height (narrower dimension) known as the critical height, may be determined for which the waveguide will support only the fundamental waveguide mode $E^y{}_{11}$. The higher the frequency of the wave being propagated, the smaller is the dimension. For high frequencies, i.e., 100 to 300 GHz and above, the dimensions are so small and tolerances so critical, that satisfactory waveguides are difficult to fabricate.

A further illustration of the state of the art of microwave integrated circuit planar high frequency mixers is the U.S. Pat. No. 4,276,655 issued June 30, 1981 to Kraemer et al. That patent, titled "Integrated Circuit Planar High Frequency Mixer" shows a truly planar crossbar signal mixer having both LO power and RF power coupled by waveguides to the same side of the substrate on which is formed the integrated circuit mixer. The circuit includes the mixer diodes, a crossbar, and a planar microwave integrated circuit low pass IF (intermediate frequency) output filter. An alternate embodiment shows the LO power coupled to one side (major surface) of the substrate and RF energy coupled via the other side (major surface) of the substrate. The device was operated at a design frequency centered at 11.8 GHz.

A copy of both the above discussed patents accompanies this application for patent and each provides useful background information and for this reason is incorporated herein by this reference.

An explanation of what is meant by "quasi-optical" with reference to high frequency mixers may be found in "A Simple Quasi-Optical Mixer for 100–120 GHz" by A. R. Kerr et al appearing in the IEEE Microwave Theory and Techniques International Microwave Symposium Digest, June 1977, a copy of which accompanies this application for patent.

SUMMARY OF THE INVENTION

A microwave integrated circuit comprising a pair of spaced apart slot antennas, a waveguide section, a pair of high cutoff gallium arsenide (GaAs) beam lead Schottky barrier diodes and an IF (intermediate frequency) low pass filter are fabricated in planar fashion, such as by photolithographic processes, on a substrate. Local oscillator (LO) power is provided to the diodes via a waveguide placed behind the diodes, and preferably centered about the diodes, on the opposite side of the substrate. Radio frequency (RF) power is passed through a spherical dielectric lens and focused onto the area of the slot antennas. The diode pair is placed between the two slot antennas, with the distance to one slot antenna being one-half wavelength different from the distance to the other slot antenna. The LO and RF waves are mixed according to a well understood mechanism and the intermediate frequency signal (IF) is output via the IF filter to a coaxial connector. By using planar fabrication technology and the dielectric lens for focusing the incoming RF signal, the precise tolerance requirements and severe size restrictions, normally encountered in waveguide devices at 100 to 300 GHz, are overcome. The mixer is considerably more compact than quasi-optical mixers using transitions from metal waveguide and other optical components such as mirrors, prisms, and grids. The major advantage of the planar design is in its reproducibility and low cost due to the use of conventional photolithographic processing and high cutoff beam lead diodes.

DETAILED DESCRIPTION OF THE INVENTION

Figure 1:
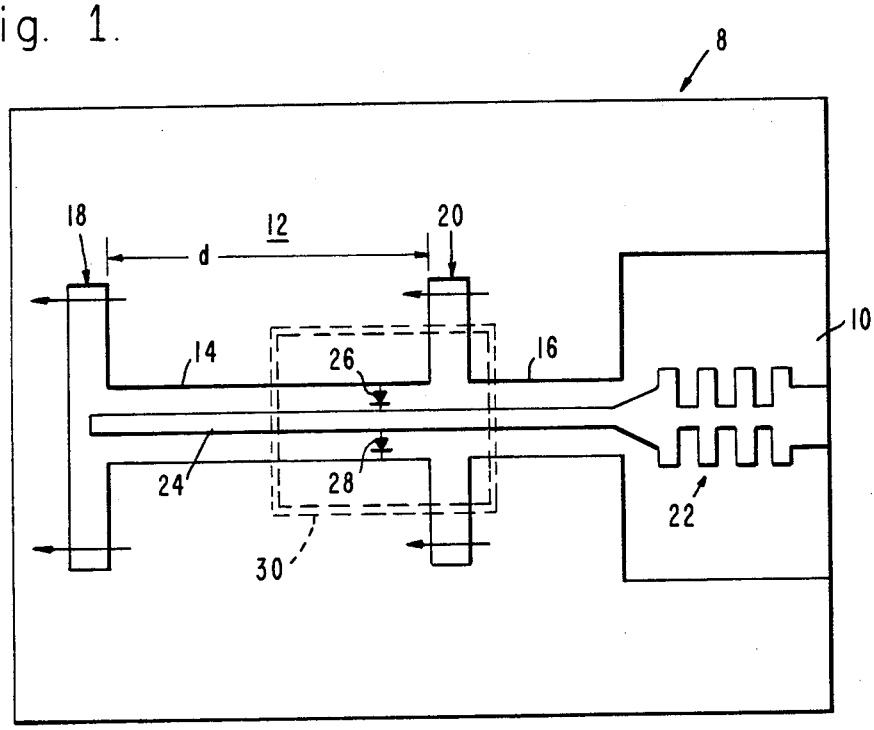
FIG. 1 is a plan view of the substrate showing the microwave integrated circuit produced thereon.
Figure 1A:
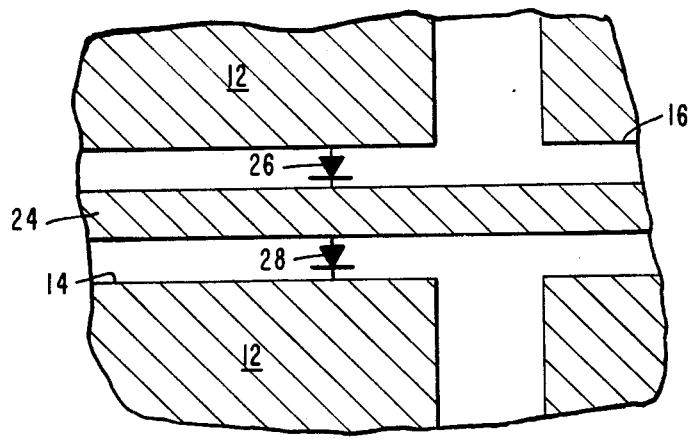
FIG. 1a is a detail view of a portion of the microwave integrated circuit showing the gallium arsenide beam lead Schottky barrier diode pair.

FIG. 1 shows the layout of the quasi-optical crossbar mixer circuit 8 fabricated on a dielectric substrate 10 using photolithographic processing techniques. The pattern is characterized by a large metalized area 12 covering a high percentage of the top surface of the substrate and a number of cleared areas, i.e. areas where no metalization covers the substrate either because none was deposited or because the metalization has been removed. The clear areas and metalized area are configured to define various microwave integrated circuit components. These components include two coplanar waveguide sections 14 and 16, a pair of slot antennas 18 and 20 separated along the waveguide by a distance d, and an intermediate frequency (IF) low pass filter 22. A crossbar member 24 extends the length of the planar waveguide sections 14 and 16 and has one end electrically and physically coupled to the low pass filter 22 and, has its other end projecting partway into slot antenna 18. A pair of high cutoff gallium arsenide (GaAs) beam lead Schottky barrier diodes 26 and 28 couple the crossbar member 24 to the metalized area 12 as shown in greater detail in FIG. 1a. The local oscillator (LO) power is fed to the diodes 26 and 28 via a conventional waveguide section 30 placed directly behind (and centered about) the diodes and on the opposite side of the substrate 10. The radio frequency (RF) signal is passed through an optical coupling means which may be a spherical dielectric lens 32 (see FIG. 2). Lens 32 not only provides a gain for the RF signal but also serves to focus the incident RF power onto the slot antenna area of the microwave integrated circuit mixer. Ideally, the lens would have a dielectric constant of about 3.50. However, no such material is readily available with good performance at millimeter wavelengths. Thus, a compromise dictates use of materials having a dielectric constant in the range of 2.0 to 2.5. Such materials include polytetrafluoroethylene, polystyrene and polyethylene. Ideally, the lens would have an elliptical shape and could also be paraboloidal or even toroidal, with multiple mixers spaced on the radially inner surface of the toroid. However, a spherical lens is shown and is preferred in order to keep cost to a minimum.

The RF signal received by the slot antennas is then coupled to the diodes 26 and 28 by the slot line-to-coplanar waveguide transition. In order for the mixer diodes 26 and 28 to efficiently perform their mixing function, the proper phase relationship must be maintained between the two RF signals coming from the two slot antennas 18 and 20. The proper phase relationship is insured by positioning the diodes 26 and 28 off-center with respect to the two antennas 18 and 20. The position of the diodes should be such that the electrical path length from the diodes to one slot antenna differs from the electrical path length to the other antenna by an odd multiple of one-half the wavelength of the RF signal. If the difference is a multiple greater than one, the RF bandwidth drops and more space is required, so one-half wavelength is preferred. After the diodes 26 and 28 perform their mixing function, the mixed electrical signal travels along crossbar member 24 to the IF filter 22. The IF output signal is provided to a coaxial coupler 40, the center conductor of which is electrically coupled to the output of the IF filter 22, and the outer conductor of which is electrically coupled to metalized area 12.

Figure 2:
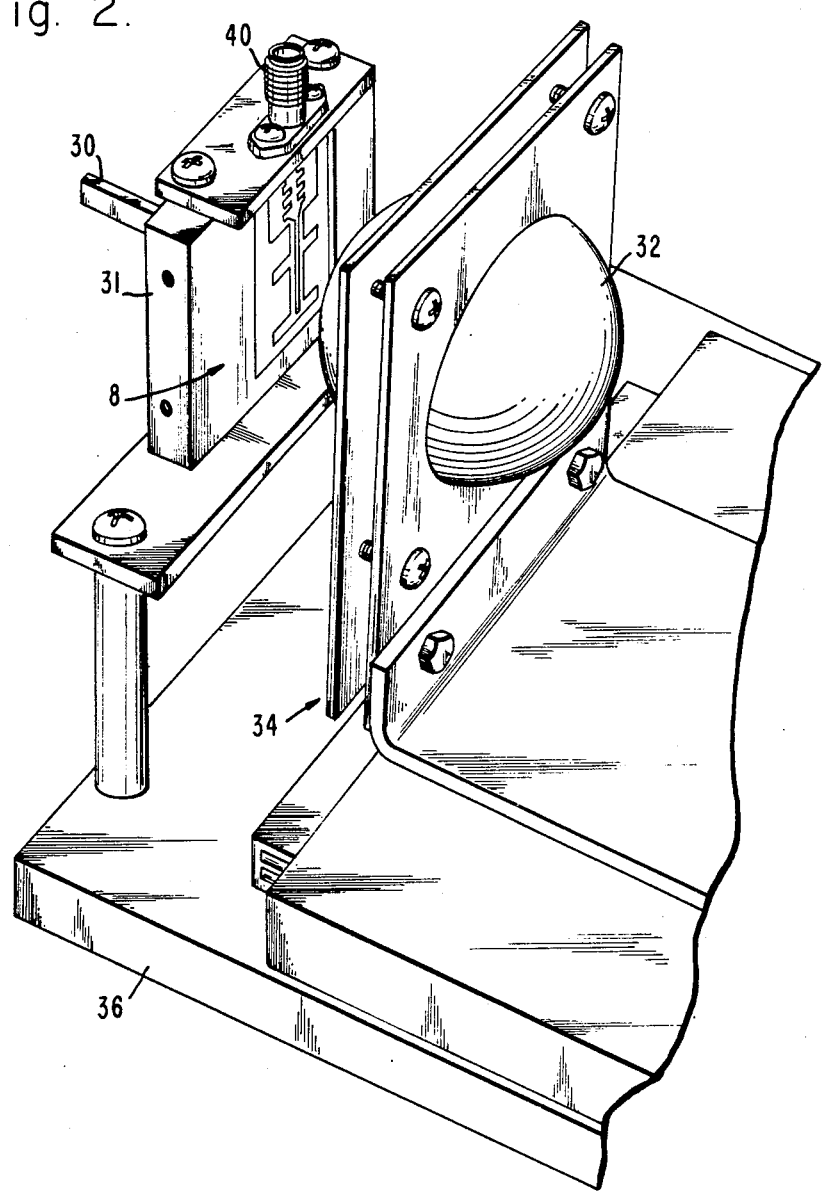
FIG. 2 is a perspective view of the microwave integrated circuit mixer device mounted in position between the LO waveguide and the RF focusing spherical lens.

In actual performance evaluation tests the mixer circuit substrate 10 was mounted vertically in a metal block 31 as shown in FIG. 2. The LO power was provided to the backside metalized surface of substrate 10 by a conventional waveguide section 30. The spherical dielectric lens 32 was mounted in a movable support structure 34 to permit focusing the RF beam onto the slot antennas 18 and 20 to optimize performance. Thus lens 32 and support structure 34 can readily be moved nearer to, or farther from, the mixer circuit, as for example along tracks provided in base member 36.

By using planar photolithographic processes to fabricate the mixer circuit, low cost batch-processing can be used. The circuit is therefore accurately reproducible. In addition, the design is applicable to monolithic fabrication using GaAs substrates. The primary advantage of using the optical coupling means, such as spherical lens 32, to couple the RF signal to the mixer, is that the physical size limitations for the fabrication of conventional waveguide components at millimeter-wave lengths are totally avoided.

Two quasi-optical crossbar mixers, one D-band (123 to 130 GHz) and one V-band (60–68.9 GHz), were fabricated according to the present invention and tested. The V-band quasi-optical mixer was fabricated on a 0.030 inch thick Duroid substrate, while the D-band mixer was fabricated on a 0.007 inch thick quartz substrate. Duroid was found sufficiently low loss for the fabrication of the V-band mixer. No appreciable degradation was observed as compared to a V-band mixer fabricated on a quartz substrate. For V-band, LO power was at 59.75 GHz, and for D-band, LO power was at 141 GHz. Conversion loss was measured over the respective IF bands (i.e. 0.25 GHz to 9.15 GHz and 11.1 GHz to 17.8 GHz). The typical conversion loss for the V-band mixer was 9 db, and for the D-band the conversion loss was 7 dB measured at 126 GHz.

Tests revealed that the performance of the mixer is very sensitive to the geometry of the circuit patterns, and particularly sensitive to the dimensions of the slot antennas and the slot separation d. Tests were run for d=0.047 inch and 0.065 inch. The smaller slot separation showed somewhat narrower bandwidth performance but lower conversion loss. The optimum length of the slot antenna was found to be approximately one-half wavelength at the center frequency.

Both the D-band and V-band mixers were fabricated using high cutoff frequency GaAs beam lead diodes fabricated at Hughes Aircraft Company's Electron Dynamics Division. The diodes have a typical zero bias junction capacitance of 30 fF (one femtofarad equals $10^{-15}$ farads) and a typical series resistance of 4.5 ohms, which corresponds to a cutoff frequency of 1178 GHz.

While the invention has been described with reference to FIGS. 1 and 2, these figures are intended merely for purposes of illustrating the principles of the invention. The invention should not be interpreted as limited to the specific circuit or structure shown in the figures. Many changes in material and structure may be made by one of ordinary skill in the art without departing from the spirit and scope of the invention as set forth in the appended claims.

What is claimed is:

1. A millimeter-wave mixer comprising:
    a planar balanced mixer circuit fabricated as a microwave integrated circuit on a first major surface of a substrate said mixer circuit including a planar intermediate frequency filter;
    a source of local oscillator power coupled to said substrate via the opposite major surface of said substrate; and
    a free-space optical coupling means for coupling radio frequency power to said first major surface;
    whereby said planar balanced mixer circuit produces an intermediate frequency signal output through the planar intermediate frequency filter of said mixer circuit.

2. The mixer according to claim 1 wherein said optical coupling means is a dielectric lens.

3. The mixer according to claim 2 wherein said dielectric lens is spherical.

4. The mixer according to claim 2 wherein said dielectric lens is comprised of a material selected from the group of, polytetrafluoroethylene, polystyrene and polyethylene.

5. The mixer according to claim 2 wherein the dielectric lens has a dielectric constant within the range of 2.0 to 2.5.

6. The mixer according to claim 2 wherein said lens is mounted in a support structure juxtaposed with said first major surface.

7. The mixer according to claim 6 wherein said support structure can be moved closer to or farther away from said first major surface so as to adjust the focus of radio frequency power by said lens upon said first major surface.

8. The mixer according to claim 1 wherein said planar balanced mixer circuit comprises:

a pair of slot antennas for receiving RF power;
a planar waveguide section coupled to said antennas;
a crossbar in said planar waveguide section, said crossbar having a first end coupled to one of said antennas, and a second end coupled to said intermediate frequency filter; and
a pair of high cutoff frequency beam lead diodes coupling said crossbar to said waveguide section for mixing local oscillator power with radio frequency power said pair of diodes being spaced from one antenna by a distance which differs from their distance to the other antenna by an odd multiple of one-half the wavelength of the center frequency of the radio frequency signal.

9. The mixer according to claim 8 wherein said odd multiple is a single one-half wavelength.

* * * * *